(12) United States Patent
Benisty et al.

(10) Patent No.: US 12,118,219 B2
(45) Date of Patent: Oct. 15, 2024

(54) ASYMMETRIC TIME DIVISION PEAK POWER MANAGEMENT (TD-PPM) TIMING WINDOWS

(71) Applicant: Western Digital Technologies, Inc., San Jose, CA (US)

(72) Inventors: Shay Benisty, Beer Sheva (IL); Yossi Yoseph Hassan, Nechusha (IL)

(73) Assignee: Sandisk Technologies, Inc., Milpitas, CA (US)

( * ) Notice: Subject to any disclaimer, the term of this patent is extended or adjusted under 35 U.S.C. 154(b) by 231 days.

(21) Appl. No.: 17/903,189

(22) Filed: Sep. 6, 2022

(65) Prior Publication Data

US 2024/0078025 A1 Mar. 7, 2024

(51) Int. Cl.
*G06F 3/06* (2006.01)
(52) U.S. Cl.
CPC .......... *G06F 3/0625* (2013.01); *G06F 3/0631* (2013.01); *G06F 3/0673* (2013.01)
(58) Field of Classification Search
CPC .................................................. G11C 16/32
See application file for complete search history.

(56) References Cited

U.S. PATENT DOCUMENTS

| 10,013,345 | B2 | 7/2018 | Erez et al. |
| 10,095,412 | B2 | 10/2018 | Hsu et al. |
| 10,365,703 | B2 | 7/2019 | Ha et al. |
| 10,712,955 | B2 | 7/2020 | Jeon et al. |
| 10,831,384 | B2 | 11/2020 | Myers et al. |
| 11,029,746 | B2 | 6/2021 | Cariello et al. |
| 11,373,710 | B1* | 6/2022 | Hsu .......... G11C 16/30 |
| 2011/0058421 | A1* | 3/2011 | Warren .......... G11C 5/063 |
| | | | 365/185.11 |
| 2011/0173462 | A1 | 7/2011 | Wakrat et al. |
| 2014/0112079 | A1 | 4/2014 | Wakrat et al. |
| 2018/0267708 | A1* | 9/2018 | Shin .......... G06F 3/061 |
| 2018/0322928 | A1* | 11/2018 | Louie .......... G11C 11/5642 |
| 2019/0079573 | A1 | 3/2019 | Hanson et al. |
| 2020/0133365 | A1 | 4/2020 | Muccini et al. |
| 2020/0356304 | A1 | 11/2020 | Jung |
| 2021/0124511 | A1 | 4/2021 | Cariello et al. |
| 2021/0286532 | A1* | 9/2021 | Palmer .......... G11C 5/143 |
| 2021/0303209 | A1 | 9/2021 | Chun |
| 2021/0382804 | A1 | 12/2021 | Alrod et al. |

* cited by examiner

*Primary Examiner* — Douglas King
(74) *Attorney, Agent, or Firm* — PATTERSON + SHERIDAN, LLP (57) ABSTRACT

A data storage device includes a memory device and a controller. The controller is configured to assert a strobe cycle having a plurality of strobes to the memory device, where a die of the memory device may be associated with one or more strobes of the plurality of strobes. The controller is further configured to determine whether the die of the memory device requires additional power and adjust a strobe length of time of the corresponding strobe when the die of the memory device requires additional power. The controller is further configured to decrease a strobe length of time of one or more strobes that do not require additional power. By utilizing a time division peak power management (TD-PPM) feature by dynamically changing a strobe length of time of each strobe of the plurality of strobes, performance and latency of the data storage device may be improved.

20 Claims, 9 Drawing Sheets

ASYMMETRIC TIME DIVISION PEAK POWER MANAGEMENT (TD-PPM) TIMING WINDOWS

BACKGROUND OF THE DISCLOSURE

Field of the Disclosure

Embodiments of the present disclosure generally relate to data storage devices, such as solid state drives (SSDs), and, more specifically, performing time division peak power management (TD-PPM) operations.

Description of the Related Art

Time division peak power management (TD-PPM) is a feature in data storage devices dealing with the strobe cycles sent between a controller of the data storage device and a memory device of the data storage device. TD-PPM is a feature to help improve peak power management. During the operation of the memory device, there are points in time where the memory device consumes a temporary higher peak power. For example, when two or more dies are accessed at the same time or during the same strobe of the strobe cycle, the power usage may peak temporarily. The power management system of the data storage device operation may need to take into consideration that power peaks from the usage of several dies may occur at the same time and develop a power management scheme to minimize the risk of the data storage device consuming a greater amount of power than allowed.

Therefore, there is a need in the art to leverage the TD-PPM feature to optimize a power usage of the data storage device.

SUMMARY OF THE DISCLOSURE

The present disclosure generally relates to data storage devices, such as solid state drives (SSDs), and, more specifically, performing time division peak power management (TD-PPM) operations. A data storage device includes a memory device and a controller. The controller is configured to assert a strobe cycle having a plurality of strobes to the memory device, where a die of the memory device may be associated with one or more strobes of the plurality of strobes. The controller is further configured to determine whether the die of the memory device requires additional power and adjust a strobe length of time of the corresponding strobe when the die of the memory device requires additional power. The controller is further configured to decrease a strobe length of time of one or more strobes that do not require additional power. By utilizing a time division peak power management (TD-PPM) feature by dynamically changing a strobe length of time of each strobe of the plurality of strobes, performance and latency of the data storage device may be improved.

In one embodiment, a data storage device includes a memory device having a plurality of sets of dies and a controller coupled to the memory device. At least one set of dies of the plurality of sets of dies includes a plurality of dies. Each of the plurality of sets of dies is associated with a memory device channel. The controller is configured to determine whether a die of the plurality of dies requires additional power and adjust a strobe length of time of a strobe corresponding to the die based on the determining. The strobe is part of a strobe cycle having a plurality of strobes. Each strobe of the plurality of strobes is associated with a die of the plurality of dies of the memory device. Each die of the plurality of dies is associated with one or more strobes of the plurality of strobes.

In another embodiment, a data storage device includes a memory device having a plurality of sets of dies and a controller coupled to the memory device. At least one set of dies of the plurality of sets of dies includes a plurality of dies. Each of the plurality of sets of dies is associated with a memory device channel. The controller includes a flash interface module (FIM), a FIM physical layer (PHY) coupled to the FIM and the memory device, a data-path module coupled to the FIM, and a TD-PPM manager module coupled to the data-path module and the FIM. The FIM PHY is configured to assert a time division peak power management (TD-PPM) strobe signal. The TD-PPM strobe signal comprises a strobe cycle having a plurality of strobes. Each die of the plurality of dies is associated with one or more strobes of the plurality of strobes. The data-path module is configured to process data to be programmed to the memory device. The TD-PPM manager module is configured to adjust a strobe length of time of a strobe of the TD-PPM strobe signal based on information received from the data path.

In another embodiment, a data storage device includes memory means and a controller coupled to the memory means. The controller is configured to assert a time division peak power management (TD-PPM) strobe signal to the memory means, where the TD-PPM strobe signal comprises a strobe cycle having a plurality of strobes, increase a strobe length of time of one or more strobes of the plurality of strobes, and decrease a strobe length of time of a remaining one or more strobes of the plurality of strobes, where the remaining one or more strobes are different than the one or more strobes.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specifically described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to data storage devices, such as solid state drives (SSDs), and, more specifically, performing time division peak power management (TD-PPM) operations. A data storage device includes a memory device and a controller. The controller is configured to assert a strobe cycle having a plurality of strobes to the memory device, where a die of the memory device may be associated with one or more strobes of the plurality of strobes. The controller is further configured to determine whether the die of the memory device requires additional power and adjust a strobe length of time of the corresponding strobe when the die of the memory device requires additional power. The controller is further configured to decrease a strobe length of time of one or more strobes that do not require additional power. By utilizing a time division peak power management (TD-PPM) feature by dynamically changing a strobe length of time of each strobe of the plurality of strobes, performance and latency of the data storage device may be improved.

Figure 1:
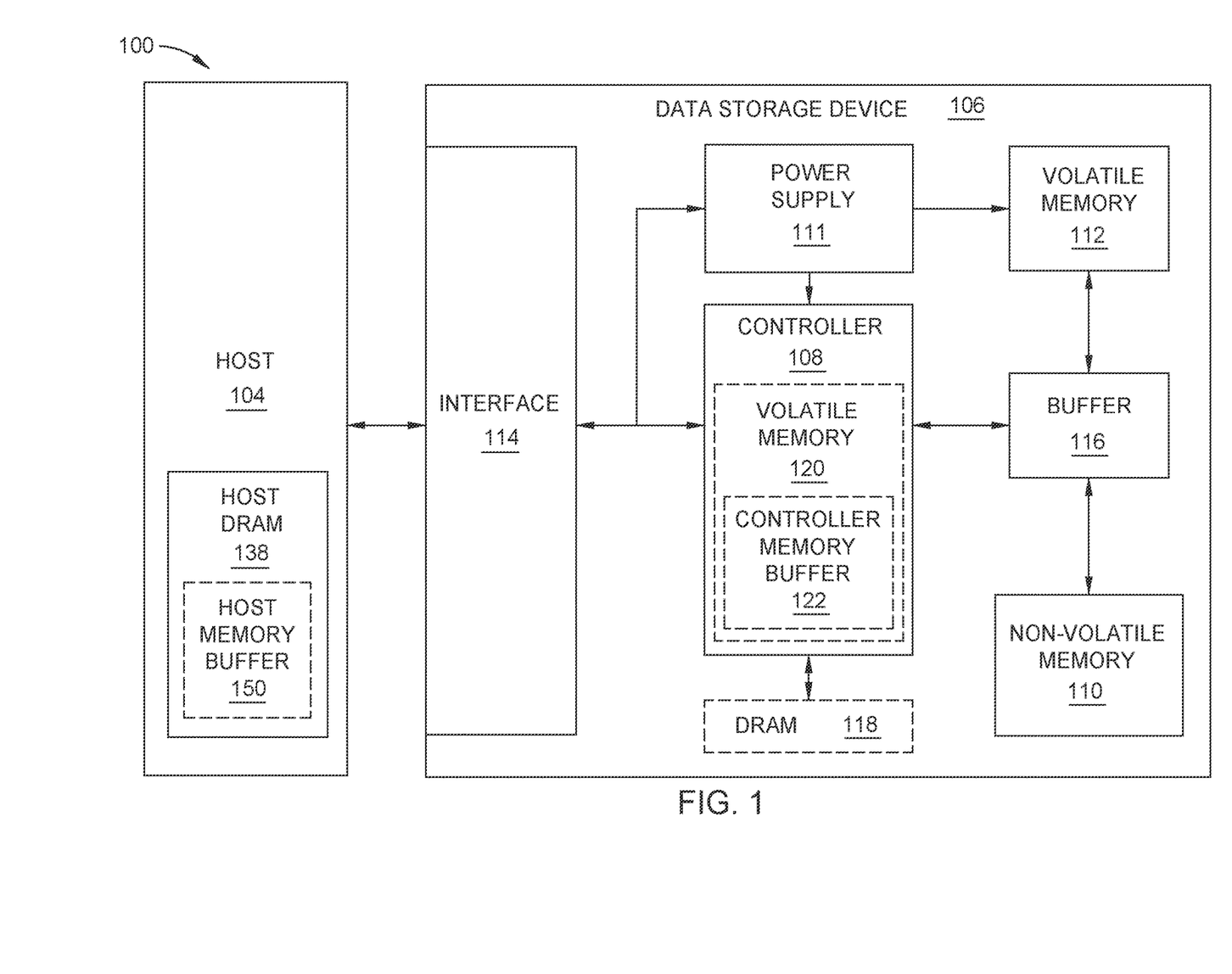
FIG. 1 is a schematic block diagram illustrating a storage system in which a data storage device may function as a storage device for a host device, according to certain embodiments.

FIG. 1 is a schematic block diagram illustrating a storage system 100 having a data storage device 106 that may function as a storage device for a host device 104, according to certain embodiments. For instance, the host device 104 may utilize a non-volatile memory (NVM) 110 included in data storage device 106 to store and retrieve data. The host device 104 comprises a host DRAM 138. In some examples, the storage system 100 may include a plurality of storage devices, such as the data storage device 106, which may operate as a storage array. For instance, the storage system 100 may include a plurality of data storage devices 106 configured as a redundant array of inexpensive/independent disks (RAID) that collectively function as a mass storage device for the host device 104.

The host device 104 may store and/or retrieve data to and/or from one or more storage devices, such as the data storage device 106. As illustrated in FIG. 1, the host device 104 may communicate with the data storage device 106 via an interface 114. The host device 104 may comprise any of a wide range of devices, including computer servers, network-attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, or other devices capable of sending or receiving data from a data storage device.

The host DRAM 138 may optionally include a host memory buffer (HMB) 150. The HMB 150 is a portion of the host DRAM 138 that is allocated to the data storage device 106 for exclusive use by a controller 108 of the data storage device 106. For example, the controller 108 may store mapping data, buffered commands, logical to physical (L2P) tables, metadata, and the like in the HMB 150. In other words, the HMB 150 may be used by the controller 108 to store data that would normally be stored in a volatile memory 112, a buffer 116, an internal memory of the controller 108, such as static random access memory (SRAM), and the like. In examples where the data storage device 106 does not include a DRAM (i.e., optional DRAM 118), the controller 108 may utilize the HMB 150 as the DRAM of the data storage device 106.

The data storage device 106 includes the controller 108, NVM 110, a power supply 111, volatile memory 112, the interface 114, a write buffer 116, and an optional DRAM 118. In some examples, the data storage device 106 may include additional components not shown in FIG. 1 for the sake of clarity. For example, the data storage device 106 may include a printed circuit board (PCB) to which components of the data storage device 106 are mechanically attached and which includes electrically conductive traces that electrically interconnect components of the data storage device 106 or the like. In some examples, the physical dimensions and connector configurations of the data storage device 106 may conform to one or more standard form factors. Some example standard form factors include, but are not limited to, 3.5" data storage device (e.g., an HDD or SSD), 2.5" data storage device, 1.8" data storage device, peripheral component interconnect (PCI), PCI-extended (PCI-X), PCI Express (PCIe) (e.g., PCIe×1, ×4, ×8, ×16, PCIe Mini Card, MiniPCI, etc.). In some examples, the data storage device 106 may be directly coupled (e.g., directly soldered or plugged into a connector) to a motherboard of the host device 104.

Interface 114 may include one or both of a data bus for exchanging data with the host device 104 and a control bus for exchanging commands with the host device 104. Interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), Open Channel SSD (OCSSD), or the like. Interface 114 (e.g., the data bus, the control bus, or both) is electrically connected to the controller 108, providing an electrical connection between the host device 104 and the controller 108, allowing data to be exchanged between the host device 104 and the controller 108. In some examples, the electrical connection of interface 114 may also permit the data storage device 106 to receive power from the host device 104. For example, as illustrated in FIG. 1, the power supply 111 may receive power from the host device 104 via interface 114.

The NVM 110 may include a plurality of memory devices or memory units. NVM 110 may be configured to store and/or retrieve data. For instance, a memory unit of NVM 110 may receive data and a message from controller 108 that instructs the memory unit to store the data. Similarly, the memory unit may receive a message from controller 108 that instructs the memory unit to retrieve data. In some examples, each of the memory units may be referred to as a die. In some examples, the NVM 110 may include a plurality of dies (i.e., a plurality of memory units). In some examples, each memory unit may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, each memory unit may include any type of non-volatile memory devices, such as flash memory devices, phase-change memory (PCM) devices, resistive random-access memory (ReRAM) devices, magneto-resistive random-access memory (MRAM) devices, ferroelectric random-access memory (F-RAM), holographic memory devices, and any other type of non-volatile memory devices.

The NVM 110 may comprise a plurality of flash memory devices or memory units. NVM Flash memory devices may include NAND or NOR-based flash memory devices and may store data based on a charge contained in a floating gate of a transistor for each flash memory cell. In NVM flash memory devices, the flash memory device may be divided into a plurality of dies, where each die of the plurality of dies includes a plurality of physical or logical blocks, which may be further divided into a plurality of pages. Each block of the plurality of blocks within a particular memory device may include a plurality of NVM cells. Rows of NVM cells may be electrically connected using a word line to define a page of a plurality of pages. Respective cells in each of the plurality of pages may be electrically connected to respective bit lines. Furthermore, NVM flash memory devices may be 2D or 3D devices and may be single level cell (SLC), multi-level cell (MLC), triple level cell (TLC), or quad level cell (QLC). The controller 108 may write data to and read data from NVM flash memory devices at the page level and erase data from NVM flash memory devices at the block level.

The power supply 111 may provide power to one or more components of the data storage device 106. When operating in a standard mode, the power supply 111 may provide power to one or more components using power provided by an external device, such as the host device 104. For instance, the power supply 111 may provide power to the one or more components using power received from the host device 104 via interface 114. In some examples, the power supply 111 may include one or more power storage components configured to provide power to the one or more components when operating in a shutdown mode, such as where power ceases to be received from the external device. In this way, the power supply 111 may function as an onboard backup power source. Some examples of the one or more power storage components include, but are not limited to, capacitors, super-capacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

The volatile memory 112 may be used by controller 108 to store information. Volatile memory 112 may include one or more volatile memory devices. In some examples, controller 108 may use volatile memory 112 as a cache. For instance, controller 108 may store cached information in volatile memory 112 until the cached information is written to the NVM 110. As illustrated in FIG. 1, volatile memory 112 may consume power received from the power supply 111. Examples of volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)). Likewise, the optional DRAM 118 may be utilized to store mapping data, buffered commands, logical to physical (L2P) tables, metadata, cached data, and the like in the optional DRAM 118. In some examples, the data storage device 106 does not include the optional DRAM 118, such that the data storage device 106 is DRAM-less. In other examples, the data storage device 106 includes the optional DRAM 118.

Controller 108 may manage one or more operations of the data storage device 106. For instance, controller 108 may manage the reading of data from and/or the writing of data to the NVM 110. In some embodiments, when the data storage device 106 receives a write command from the host device 104, the controller 108 may initiate a data storage command to store data to the NVM 110 and monitor the progress of the data storage command. Controller 108 may determine at least one operational characteristic of the storage system 100 and store at least one operational characteristic in the NVM 110. In some embodiments, when the data storage device 106 receives a write command from the host device 104, the controller 108 temporarily stores the data associated with the write command in the internal memory or write buffer 116 before sending the data to the NVM 110.

The controller 108 may include an optional second volatile memory 120. The optional second volatile memory 120 may be similar to the volatile memory 112. For example, the optional second volatile memory 120 may be SRAM. The controller 108 may allocate a portion of the optional second volatile memory to the host device 104 as controller memory buffer (CMB) 122. The CMB 122 may be accessed directly by the host device 104. For example, rather than maintaining one or more submission queues in the host device 104, the host device 104 may utilize the CMB 122 to store the one or more submission queues normally maintained in the host device 104. In other words, the host device 104 may generate commands and store the generated commands, with or without the associated data, in the CMB 122, where the controller 108 accesses the CMB 122 in order to retrieve the stored generated commands and/or associated data.

Figure 2:
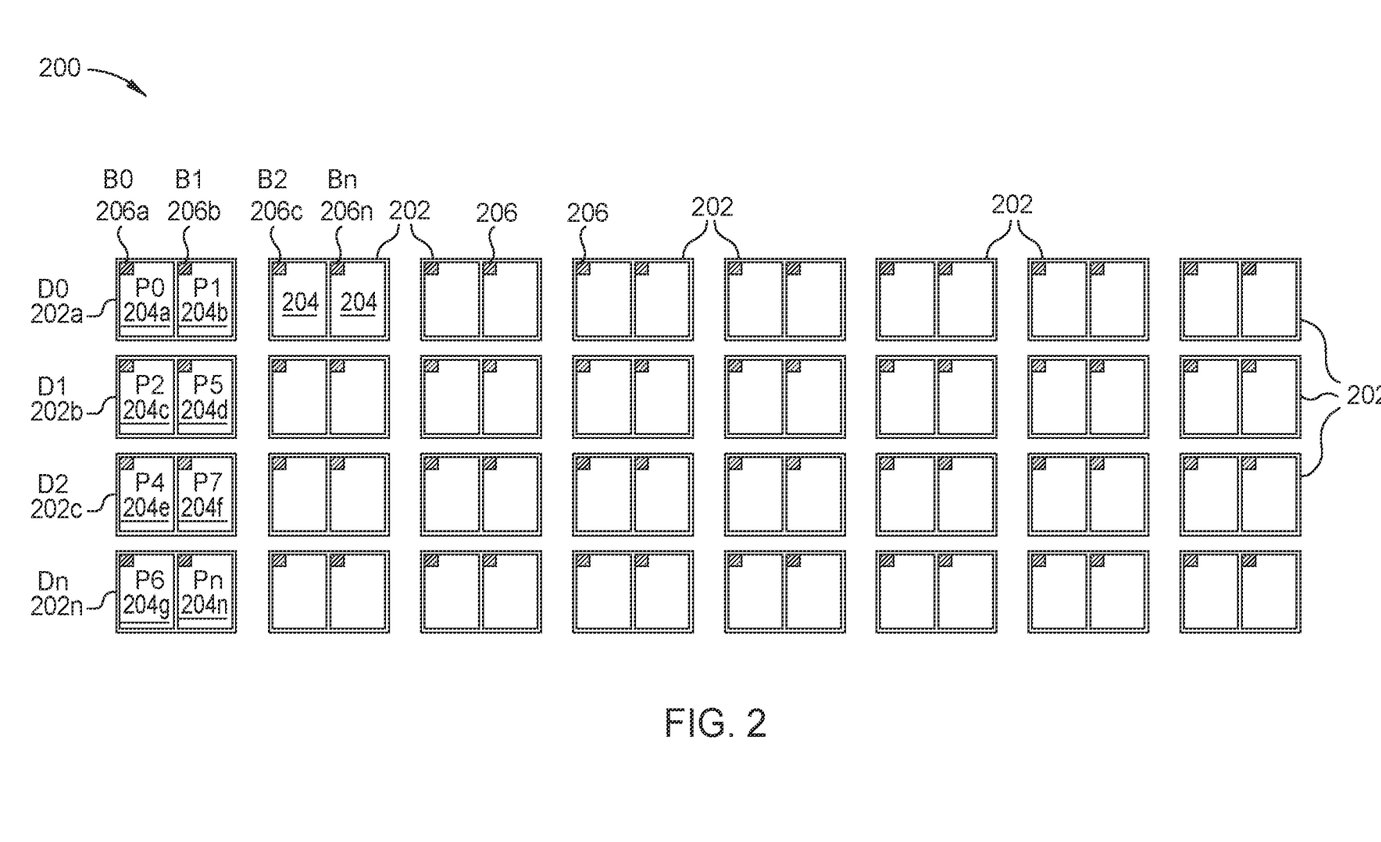
FIG. 2 is an illustration of a memory device, according to certain embodiments.

FIG. 2 is an illustration of a memory device 200, which may be the NVM 110 of FIG. 1, according to certain embodiments. The memory device 200 includes a plurality of dies 202a-202n, collectively referred to as dies 202, where each die of the plurality of dies 202a-202n includes a first plane 204a and a second plane 204b, collectively referred to as planes 204. Each of the planes 204 includes a plurality of blocks 206a-206n, collectively referred to as block 206. While 32 dies 502 are shown in the memory device 200, any number of dies may be included. Furthermore, the dies 202 may be split into a plurality of sets of dies, where each sets of dies has one or more distinct dies of the plurality of dies 202a-202n. For example, a first die 202a may be in a first set of dies and a second set of dies may include a second die 202b and a third die 202c. Each of the sets of dies may be associated with a flash channel of a controller, such as the controller 108 of FIG. 1, where the controller includes a flash interface module (FIM). The FIM may be configured to read data from and write data to the memory device 200, where commands are sent via a respective flash channel program data to a respective die the memory device 200 or read data from a respective die of the memory device 200.

Figure 3:
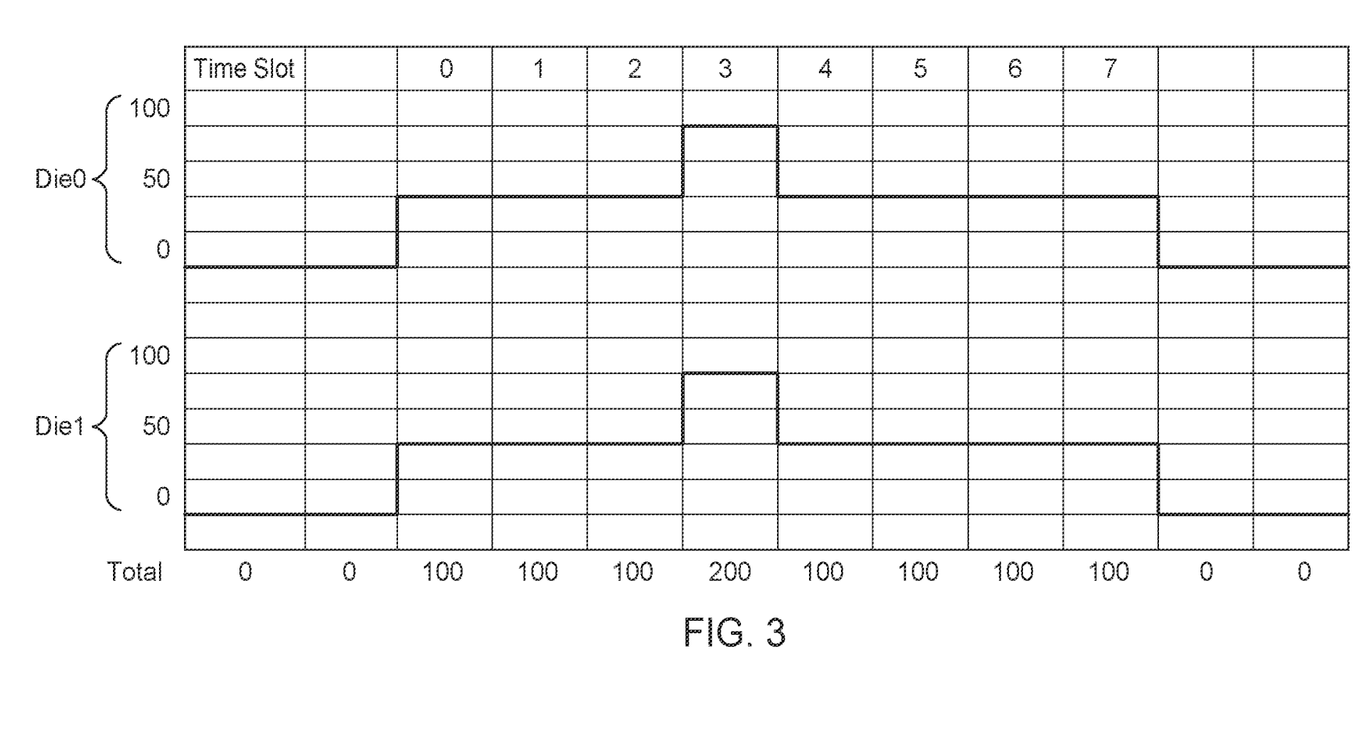
FIG. 3 is an exemplary illustration of die power consumption, according to certain embodiments.

FIG. 3 is an exemplary illustration of die power consumption, according to certain embodiments. FIG. 3 shows a first die (Die0) and a second die (Die1) and a power usage per strobe (time slot), where Die0 and Die1 may be dies of an NVM, such as the NVM 110 of the data storage device 106 of FIG. 1. From time 0 to time 2, Die0 has a power usage of 50 mW. At time 3, Die0 has a power usage of 100 mw. At time 4 to time 7, Die0 has a power usage of 50 mW. From time 0 to time 2, Die1 has a power usage of 50 mW. At time 3, Die1 has a power usage of 100 mw. At time 4 to time 7, Die1 has a power usage of 50 mW. From time 0 to time 2 and time 4 to time 7, the total power usage is 100 mW per time slot. At time 3, the total power usage peaks at 200 mW per time slot. Although FIG. 3 illustrates two dies, the described embodiments may be applicable to greater than two dies. Thus, when multiple dies have converging peak power usage at the same time slot, the overall power usage of the data storage device 106 may reach or exceed a total allotted power usage or an allowed power consumption amount.

Figure 4:
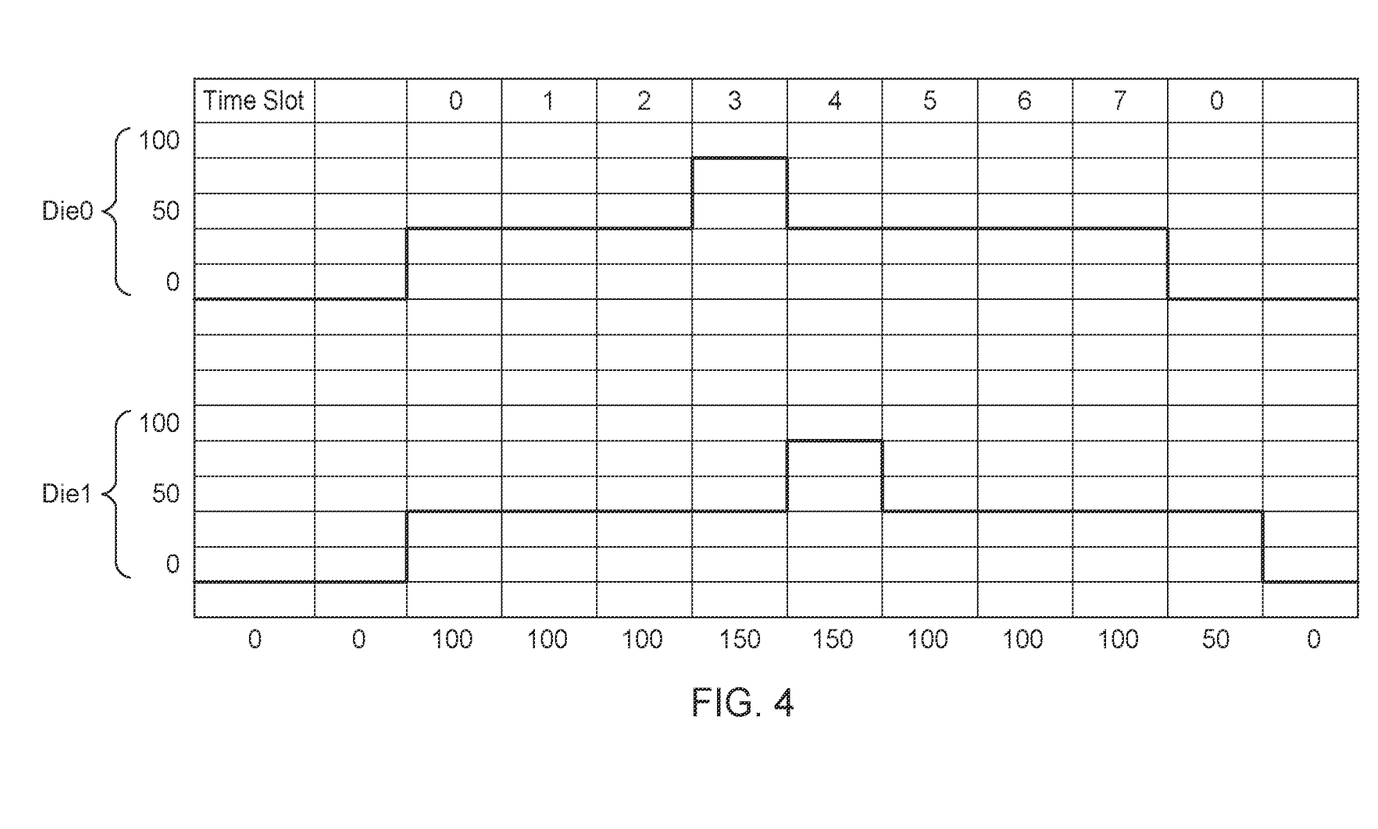
FIG. 4 is an exemplary illustration of die power consumption, according to certain embodiments.

FIG. 4 is an exemplary illustration of die power consumption, according to certain embodiments. FIG. 4 shows a first die (Die0) and a second die (Die1) and a power usage per strobe (time slot), where Die0 and Die1 may be dies of an NVM, such as the NVM 110 of the data storage device 106 of FIG. 1. From time 0 to time 2, Die0 has a power usage of 50 mW. At time 3, Die0 has a power usage of 100 mw. At time 4 to time 7, Die0 has a power usage of 50 mW. At time 7 to time 0, Die0 has a power usage of 0 mW. From time 0 to time 3, Die1 has a power usage of 50 mW. At time 4, Die1 has a power usage of 100 mw. At time 5 to time 7, Die1 has a power usage of 50 mW. At time 7 to time 0, Die1 has a power usage of 50 mW. From time 0 to time 2 and time 5 to time 7, the total power usage is 100 mW per time slot. At time 3 to time 4, the total power usage peaks at 150 mW per time slot. At time 4 to time 5, the total power usage is 150 mW. At time 7 to time 0, the total power usage is 50 mW. Although FIG. 4 illustrates two dies, the described embodiments may be applicable to greater than two dies.

By using a time division peak power management (TD-PPM) feature, a controller, such as the controller 108, may cause Die0 and Die1 to not peak in power usage during the same time slot so that the total power usage for a time slot does not exceed a threshold total power usage. In other words, the controller 108 may set an allowed power usage of each die per time slot. In other words, referring back to FIG. 4, the controller 108 may allow Die0 to consume the peak power at time 3 and Die1 to consume the peak power at time 4.

Figure 5:
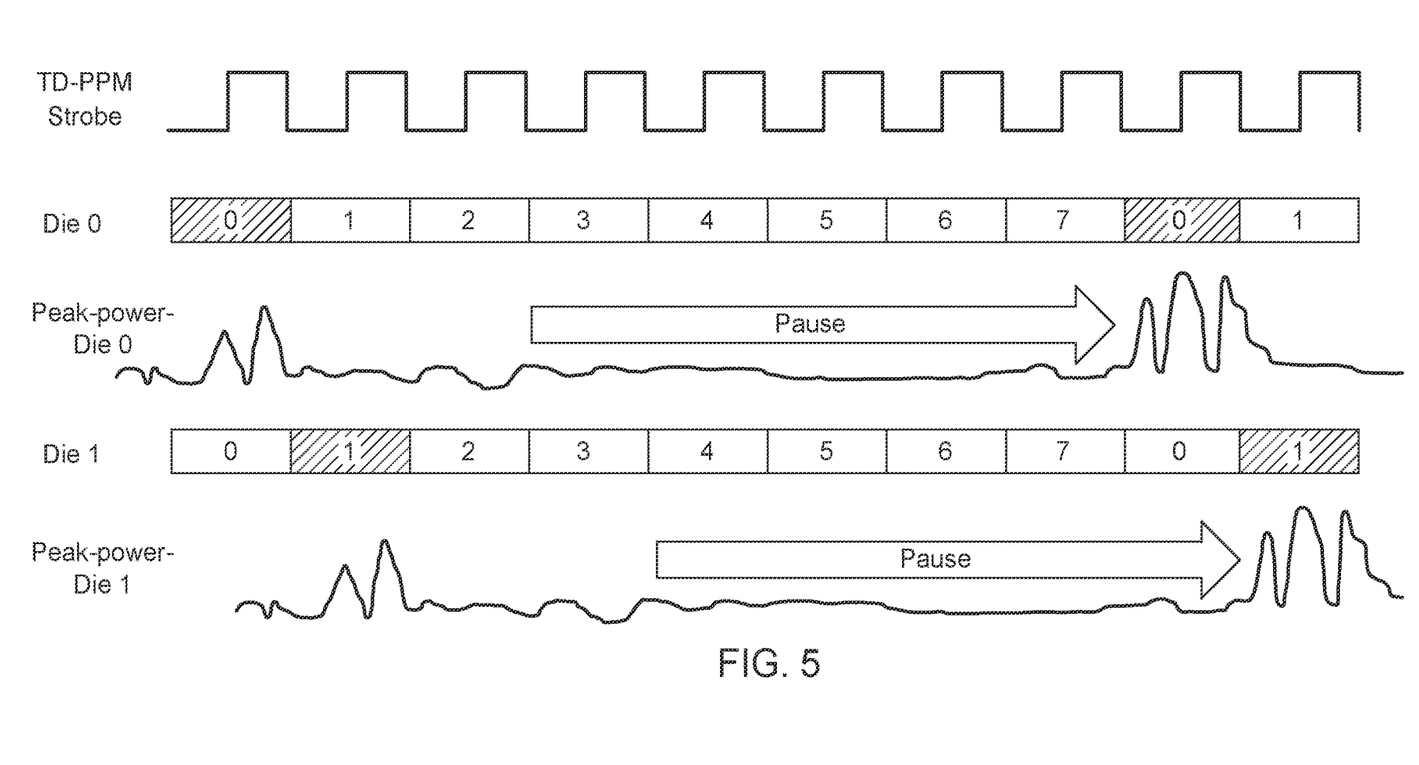
FIG. 5 is an exemplary illustration of a data storage device having the TD-PPM feature, according to certain embodiments.

FIG. 5 is an exemplary illustration of a data storage device, such as the data storage device 106, having the TD-PPM feature, according to certain embodiments. For exemplary purposes, the storage system 100 of FIG. 1 may be referenced herein. The controller 108 drives the strobe (or clock) in order to notify the NVM 110 when to switch to the next TD-PPM time slot. Each die is statically associated with one or more TD-PPM time slots or strobes of a strobe cycle having a plurality of strobes. During a time slot, where a die is associated with the time slot, the die is allowed to consume the peak power. If the operation is incomplete during the time slot, the operation is continued during the next TD-PPM time slot that is assigned to the die. For example, Die0 is allotted time slot 0 and Die1 is allotted time 1. During time slot 0, an operation is performed to Die0. However, the operation is incomplete when the next time slot (time slot 1) occurs. The operation to Die0 is paused until time slot 0 occurs again, where the operation is resumed when time slot 0 occurs again. Thus, when the TD-PPM time slots are cyclic incremented, a die may need to wait for its next assigned time slot to continue an operation even when the operation is a high-priority task or when other dies associated with the other time slots are not active, which may cause unnecessarily pauses in performing data storage device operations.

Figure 6:
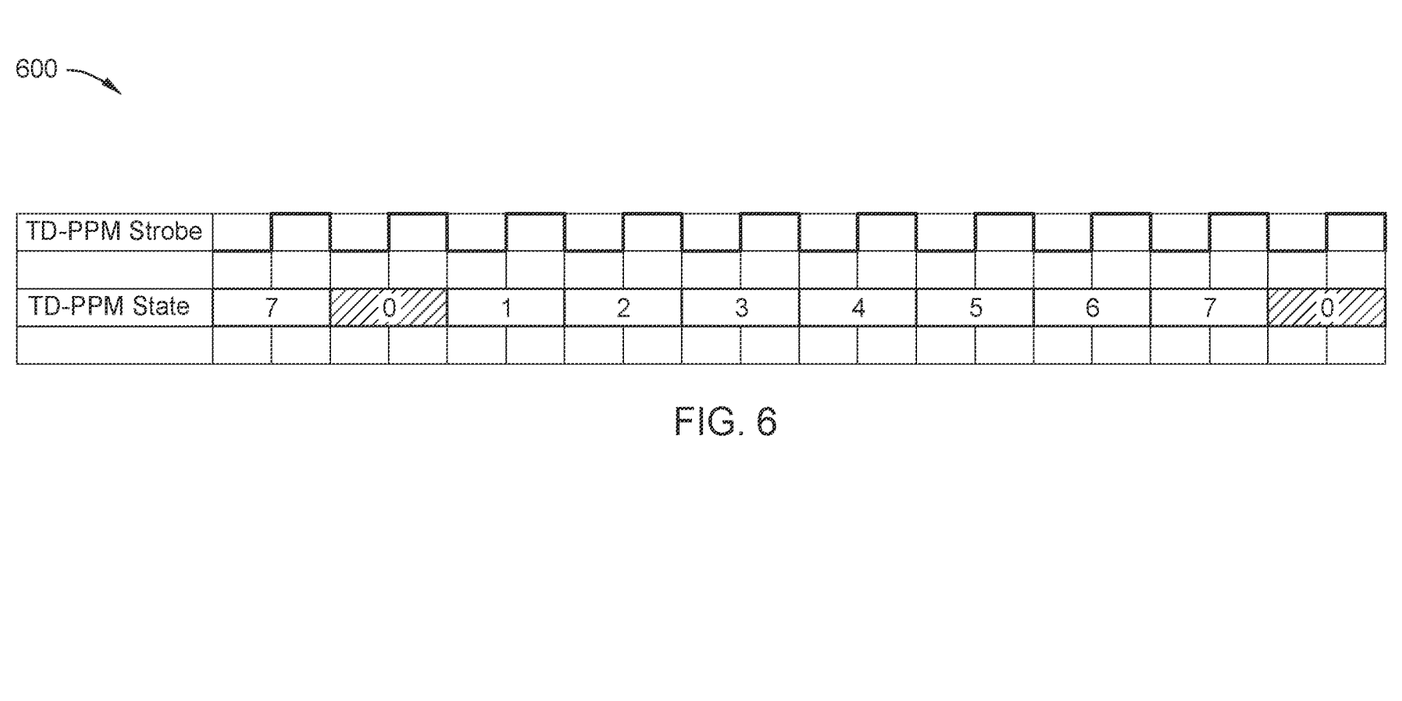
FIG. 6 is an exemplary illustration of a symmetric TD-PPM strobe cycle, according to certain embodiments.

FIG. 6 is an exemplary illustration of a symmetric TD-PPM strobe cycle 600, according to certain embodiments. The symmetric TD-PPM strobe cycle 600 includes a plurality of strobes (i.e., strobe 0 to strobe 7). It is to be understood that the total number of strobes in the symmetric TD-PPM strobe cycle 600 is not intended to be limiting, but to provide an example of a possible embodiment. A strobe length of time is a measure of time that a strobe of the plurality of strobes occurs for. In other words, the strobe length of time is the total amount of time of a time slot associated with a strobe. As shown in the symmetric TD-PPM strobe cycle 600, each strobe has an equal strobe length of time. Thus, power is allocated equally among each of the dies associated with each strobe of the plurality of strobes. For example, if strobe 0 is associated with a first die and strobe 1 is associated with a second die, then the power allocated to both the first die and the second die are equal. Furthermore, each of the other strobes are allocated the same amount of power as the first die and the second die. When more than one strobe is associated with the first die (e.g., strobe 0 and strobe 2) and one strobe is associated with the second die, then the power allocated for the first die is double the power allocated for the second die.

Figure 7:
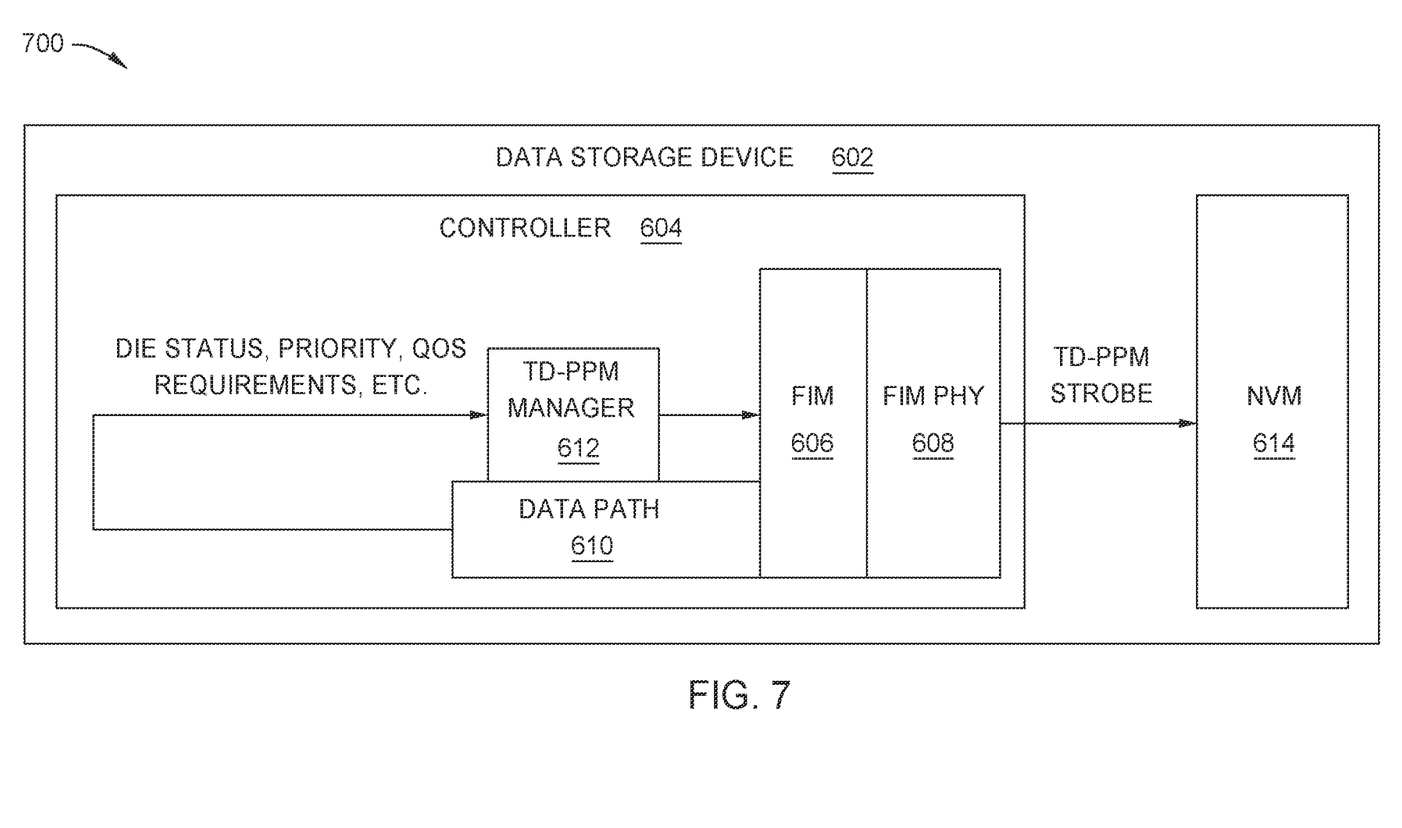
FIG. 7 is an exemplary illustration of a data storage device having a TD-PPM manager managing a TD-PPM strobe, according to certain embodiments.

FIG. 7 is an exemplary illustration of a data storage device 702 having a TD-PPM manager 712 managing a TD-PPM strobe, according to certain embodiments. The data storage device 702 includes a controller 704 and an NVM 714. The controller 704 may be the controller 108 of FIG. 1 and the NVM 714 may be the NVM 110 of FIG. 1. The controller 704 includes a flash interface module (FIM) 706 configured to read data from and write data to the NVM 110, a FIM physical layer (PHY) 708 coupled to the FIM 706, where the FIM PHY 708 is configured to assert the TD-PPM strobe to the NVM 714, a data path 710 coupled to the FIM 706, and the TD-PPM manager 712 coupled to the data path 710 and the FIM 706.

The TD-PPM manager 712 receives, from the data path 710, one or more of a die status, a priority, a quality of service (QoS) requirement of the commands associated with the data being processed by the data path 710, a current workload associated with each die, a number of pending operations in each die, a type of operation of any pending operations in each die, and the like. In other words, the TD-PPM manager 712 receives hints or indications from the data path 710 regarding the die usage of the NVM 714.

The TD-PPM manager 712 may dynamically determine which dies and associated time slots need additional power and which dies and associated time slots do not need additional power based on the received information from the data path 710. For example, when a first die associated with a first time slot is associated with a high priority operation, the TD-PPM manager 712 may increase the strobe length of time of the first time slot. Furthermore, upon determining that the other time slots of the other strobes do not need additional power, the TD-PPM manager 712 may decrease the strobe length of time of the other time slots in order to increase overall performance and reduce a data storage device latency. Thus, the TD-PPM manager 712 may cause the FIM PHY 708 to assert an adjusted strobe cycle, where the adjusted strobe cycle may be an asymmetric TD-PPM strobe cycle. The width of a time slot compared to other time slots or the strobe length of time of a strobe compared to other strobe length of times may be a function of a required low-level memory device operation, a function of the actual peaks of each operation, a function of the time latency percentage of the operation out of the total operation, or a combination thereof.

Figure 8:
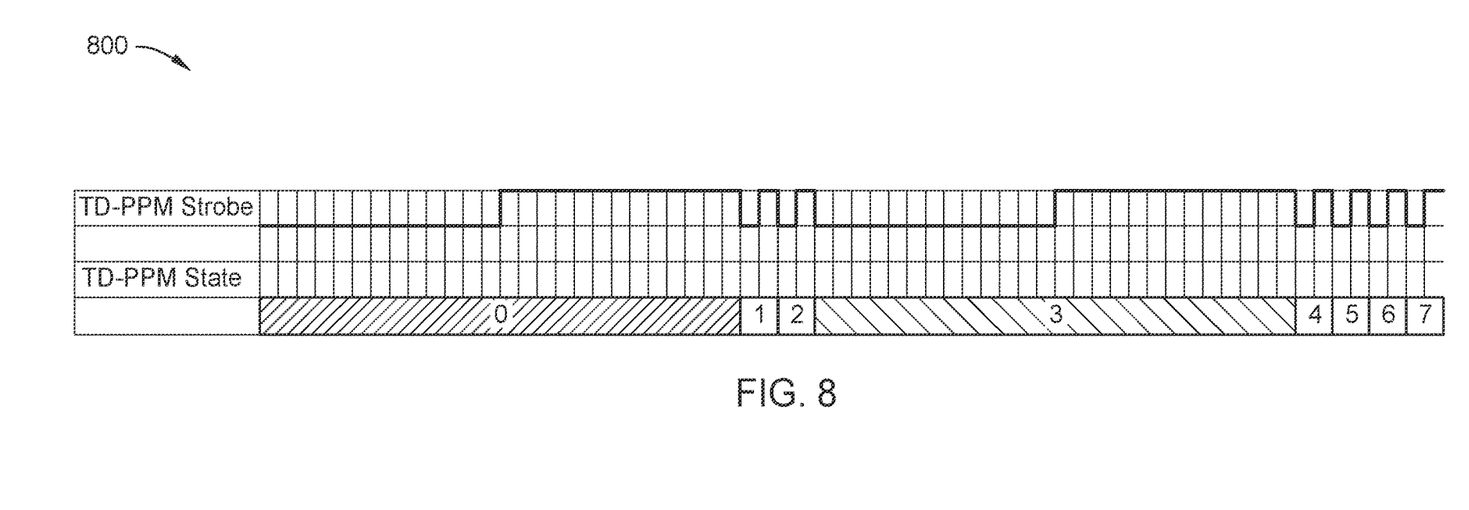
FIG. 8 is an exemplary illustration of an asymmetric TD-PPM strobe cycle, according to certain embodiments.

FIG. 8 is an exemplary illustration of an asymmetric TD-PPM strobe cycle 800, according to certain embodiments. The asymmetric TD-PPM strobe cycle 800 includes a plurality of strobes (i.e., strobe 0 to strobe 7). It is to be understood that the total number of strobes in the asymmetric TD-PPM strobe cycle 800 is not intended to be limiting, but to provide an example of a possible embodiment. A strobe length of time is a measure of time that a strobe of the plurality of strobes occurs for. In other words, the strobe length of time is the total amount of time of a time slot associated with a strobe. As shown in the asymmetric TD-PPM strobe cycle 800, a strobe of the plurality of strobes may not have an equal strobe length of time as another strobe of the plurality of strobes.

Thus, power may be allocated non-uniformly among each of the dies associated with each strobe of the plurality of strobes. For example, if a TD-PPM manager, such as the TD-PPM manager 712 of FIG. 7, determines that a first die associated with time slot 0 and a second die associated with time slot 3 requires additional power, then the TD-PPM manager 712 may send a command or assert a change in TD-PPM strobe, where a strobe length of time associated with time slot 0 and a strobe length of time associated with time slot 3 may be increased and a strobe length of time associated with each of time slot 1, time slot 2, time slot 4, time slot 5, time slot 6, and time slot 7 is decreased.

In one example, the increasing of the strobe length of time may be uniform between one or more increased time slots, such that the increased strobe length of time of time slot 0 and the increased strobe length of time of time slot 3 are equal. In another example, the increasing of the strobe length of time may be non-uniform between one or more increased time slots, such that the increased strobe length of time of time slot 0 and the increased strobe length of time of time slot 3 are not equal. It is contemplated that a mixture of the previous examples may be applicable to the described embodiments. Likewise, in one example, the decreasing of the strobe length of time may be uniform between one or more decreased time slots, such that the decreased strobe length of time of each of time slot 1, time slot 2, time slot 4, time slot 5, time slot 6, and time slot 7 is equal. In another example, the decreasing of the strobe length of time may be non-uniform between one or more decreased time slots, such that the decreased strobe length of time of each of time slot 1, time slot 2, time slot 4, time slot 5, time slot 6, and time slot 7 is not equal. It is contemplated that a mixture of the previous examples may be applicable to the described embodiments.

Figure 9:
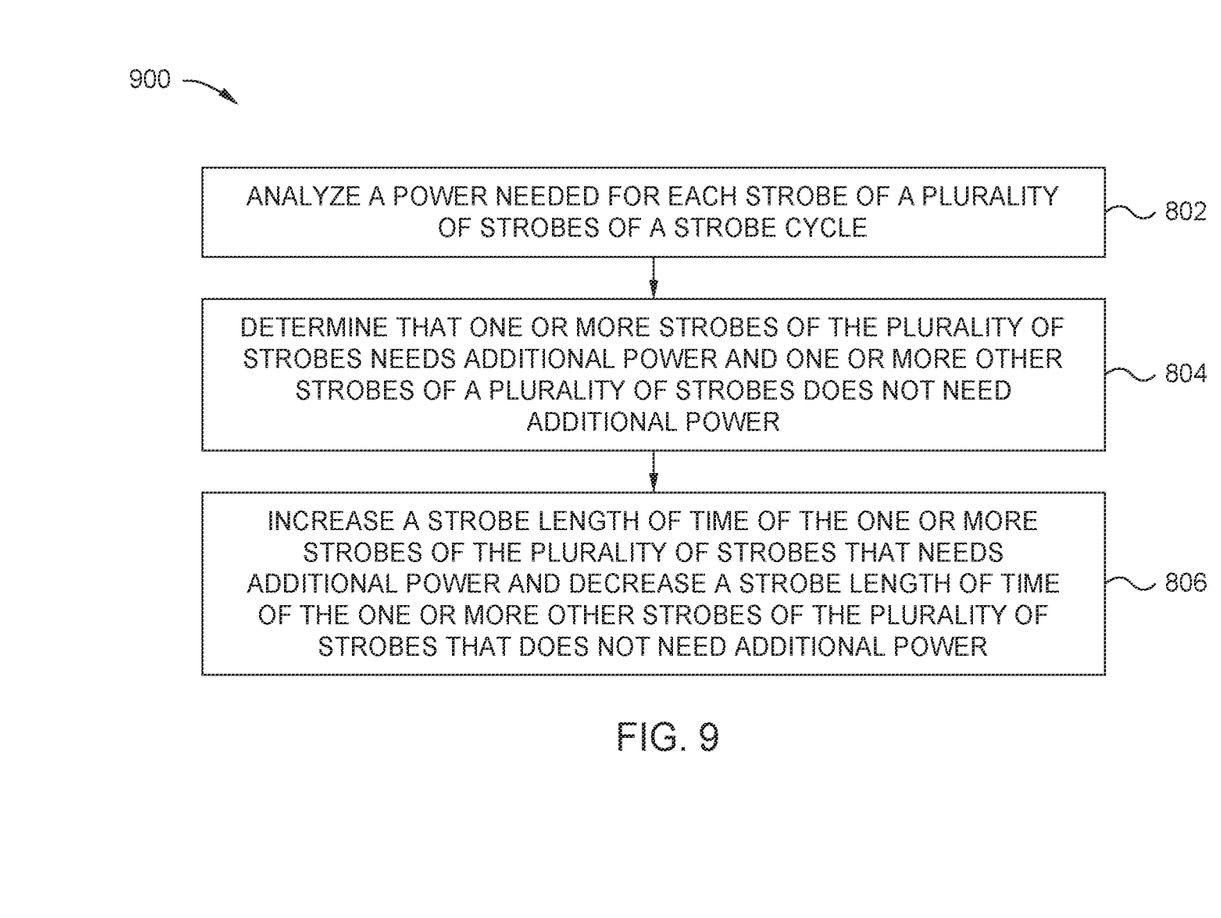
FIG. 9 is a flow diagram illustrating a method of adjusting a strobe length of time using the TD-PPM feature, according to certain embodiments.

FIG. 9 is a flow diagram illustrating a method 900 of adjusting a strobe length of time using the TD-PPM feature, according to certain embodiments. Method 900 may be implemented by a controller, such as the controller 108 of FIG. 1 and/or the controller 704 of FIG. 7, or by a TD-PPM manager, such as the TD-PPM manager 712 of FIG. 7. At block 902, the TD-PPM manager 712 analyzes a power needed for each die associated with a strobe cycle. At block 904, the TD-PPM manager 712 determines that one or more dies associated with one or more strobes of the plurality of strobes needs additional power and one or more other dies associated with one or more other strobes of the plurality of strobes does not need additional power. At block 906, the TD-PPM manager 712 increases a strobe length of time of the one or more strobes of the plurality of strobes that needs additional power and decreases a strobe length of time of the one or more other strobes of the plurality of strobes that does not need additional power.

By adjusting a strobe length of time of strobes of a strobe cycle, where a die is associated with one or more strobes of the strobe cycle, the total power requirement of the data storage device may be decreased, the latency associated with the data storage device may be improved, and the performance of the data storage device may be improved.

In one embodiment, a data storage device includes a memory device having a plurality of sets of dies and a controller coupled to the memory device. At least one set of dies of the plurality of sets of dies includes a plurality of dies. Each of the plurality of sets of dies is associated with a memory device channel. The controller is configured to determine whether a die of the plurality of dies requires additional power and adjust a strobe length of time of a strobe corresponding to the die based on the determining. The strobe is part of a strobe cycle having a plurality of strobes. Each strobe of the plurality of strobes is associated with a die of the plurality of dies of the memory device. Each die of the plurality of dies is associated with one or more strobes of the plurality of strobes.

Adjusting the strobe length of time includes either increasing the strobe length of time of the strobe when the die requires additional power or maintaining or decreasing the strobe length of time of the strobe when the die does not require additional power. Increasing the strobe length of time of the strobe further includes decreasing one or more other strobes of the plurality of strobes. Each strobe length of time of the plurality of strobes is not uniform. The determining is based on a current workload of the die. The determining is based on a type and number of pending operations associated with the die. The pending number of operations includes sense operations, transfer operations, and program operations. The determining is based on a priority of tasks queued in the die compared to a priority of tasks queued in another die of the plurality of dies. The determining is based on a die status of the die compared to a die status of another die of the plurality of dies. The adjusting is based on a function that includes a current workload of each die of the plurality of dies, a type and number of pending operations associated with each die of the plurality of dies, a priority of tasks queued in each die of the plurality of dies, and a die status of each die of the plurality of dies. The determining and the adjusting occurs dynamically.

In another embodiment, a data storage device includes a memory device having a plurality of sets of dies and a controller coupled to the memory device. At least one set of dies of the plurality of sets of dies includes a plurality of dies. Each of the plurality of sets of dies is associated with a memory device channel. The controller includes a flash interface module (FIM), a FIM physical layer (PHY)

coupled to the FIM and the memory device, a data-path module coupled to the FIM, and a TD-PPM manager module coupled to the data-path module and the FIM. The FIM PHY is configured to assert a time division peak power management (TD-PPM) strobe signal. The TD-PPM strobe signal comprises a strobe cycle having a plurality of strobes. Each die of the plurality of dies is associated with one or more strobes of the plurality of strobes. The data-path module is configured to process data to be programmed to the memory device. The TD-PPM manager module is configured to adjust a strobe length of time of a strobe of the TD-PPM strobe signal based on information received from the data path.

The information includes one or more of a current workload of each die of the plurality of dies, a type and number of pending operations associated with each die of the plurality of dies, a priority of tasks queued in each die of the plurality of dies, a die status of each die of the plurality of dies, and quality of service requirements of the current workload of each die of the plurality of dies. The adjusting includes increasing the strobe length of time of one or more strobes of the TD-PPM strobes signals and decreasing the strobe length of time of one or more other strobes of the TD-PPM strobe signal. Increasing the strobe length of time for two or more strobes occurs uniformly. Increasing the strobe length of time for two or more strobes occurs non-uniformly. Decreasing the strobe length of time for two or more strobes occurs uniformly. Decreasing the strobe length of time for two or more strobes occurs non-uniformly.

In another embodiment, a data storage device includes memory means and a controller coupled to the memory means. The controller is configured to assert a time division peak power management (TD-PPM) strobe signal to the memory means, where the TD-PPM strobe signal comprises a strobe cycle having a plurality of strobes, increase a strobe length of time of one or more strobes of the plurality of strobes, and decrease a strobe length of time of a remaining one or more strobes of the plurality of strobes, where the remaining one or more strobes are different than the one or more strobes.

The controller is further configured to decrease the increased strobe length of time of the one or more strobes of the plurality of strobes. The controller is further configured to increase the decreased strobe length of time of the remaining one or more strobes of the plurality of strobes.

While the foregoing is directed to embodiments of the present disclosure, other and further embodiments of the disclosure may be devised without departing from the basic scope thereof, and the scope thereof is determined by the claims that follow.

What is claimed is:

1. A data storage device, comprising:
   a memory device having a plurality of sets of dies, wherein:
      at least one set of dies of the plurality of sets of dies includes a plurality of dies; and
      each of the plurality of sets of dies is associated with a memory device channel; and
   a controller coupled to the memory device, wherein the controller is configured to:
      determine whether a die of the plurality of dies requires additional power; and
      adjust a strobe length of time of a strobe corresponding to the die based on the determining, wherein:
         the strobe is part of a strobe cycle having a plurality of strobes;
         each strobe of the plurality of strobes is associated with a die of the plurality of dies of the memory device; and
         each die of the plurality of dies is associated with one or more strobes of the plurality of strobes.

2. The data storage device of claim 1, wherein adjusting the strobe length of time comprises either:
   increasing the strobe length of time of the strobe when the die requires additional power; or
   maintaining or decreasing the strobe length of time of the strobe when the die does not require additional power.

3. The data storage device of claim 2, wherein increasing the strobe length of time of the strobe further comprises decreasing one or more other strobes of the plurality of strobes.

4. The data storage device of claim 1, wherein each strobe length of time of the plurality of strobes is not uniform.

5. The data storage device of claim 1, wherein the determining is based on a current workload of the die.

6. The data storage device of claim 1, wherein the determining is based on a type and number of pending operations associated with the die, and wherein the pending number of operations includes sense operations, transfer operations, and program operations.

7. The data storage device of claim 1, wherein the determining is based on a priority of tasks queued in the die compared to a priority of tasks queued in another die of the plurality of dies.

8. The data storage device of claim 1, wherein the determining is based on a die status of the die compared to a die status of another die of the plurality of dies.

9. The data storage device of claim 1, wherein the adjusting is based on a function comprising:
   a current workload of each die of the plurality of dies;
   a type and number of pending operations associated with each die of the plurality of dies;
   a priority of tasks queued in each die of the plurality of dies; and
   a die status of each die of the plurality of dies.

10. The data storage device of claim 1, wherein the determining and the adjusting occurs dynamically.

11. A data storage device, comprising:
   a memory device having a plurality of sets of dies, wherein:
      at least one set of dies of the plurality of sets of dies includes a plurality of dies; and
      each of the plurality of sets of dies is associated with a memory device channel; and
   a controller coupled to the memory device, wherein the controller comprises:
      a flash interface module (FIM);
      a FIM physical layer (PHY) coupled to the FIM and the memory device, wherein the FIM PHY is configured to assert a time division peak power management (TD-PPM) strobe signal, and wherein:
         the TD-PPM strobe signal comprises a strobe cycle having a plurality of strobes; and
         each die of the plurality of dies is associated with one or more strobes of the plurality of strobes;
      a data-path module coupled to the FIM, wherein the data-path module is configured to process data to be programmed to the memory device; and
      a TD-PPM manager module coupled to the data-path module and the FIM, wherein the TD-PPM manager module is configured to adjust a strobe length of time of a strobe of the TD-PPM strobe signal based on information received from the data path.

12. The data storage device of claim 11, wherein the information comprises one or more of:
- a current workload of each die of the plurality of dies;
- a type and number of pending operations associated with each die of the plurality of dies;
- a priority of tasks queued in each die of the plurality of dies;
- a die status of each die of the plurality of dies; and
- quality of service requirements of the current workload of each die of the plurality of dies.

13. The data storage device of claim 11, wherein the adjusting comprises increasing the strobe length of time of one or more strobes of the TD-PPM strobes signals and decreasing the strobe length of time of one or more other strobes of the TD-PPM strobe signal.

14. The data storage device of claim 13, wherein increasing the strobe length of time for two or more strobes occurs uniformly.

15. The data storage device of claim 13, wherein increasing the strobe length of time for two or more strobes occurs non-uniformly.

16. The data storage device of claim 13, wherein decreasing the strobe length of time for two or more strobes occurs uniformly.

17. The data storage device of claim 13, wherein decreasing the strobe length of time for two or more strobes occurs non-uniformly.

18. A data storage device, comprising:
- memory means; and
- a controller coupled to the memory means, wherein the controller is configured to:
  - assert a time division peak power management (TD-PPM) strobe signal to the memory means, wherein the TD-PPM strobe signal comprises a strobe cycle having a plurality of strobes;
  - increase a strobe length of time of one or more strobes of the plurality of strobes; and
  - decrease a strobe length of time of a remaining one or more strobes of the plurality of strobes, wherein the remaining one or more strobes are different than the one or more strobes.

19. The data storage device of claim 18, wherein the controller is further configured to decrease the increased strobe length of time of the one or more strobes of the plurality of strobes.

20. The data storage device of claim 18, wherein the controller is further configured to increase the decreased strobe length of time of the remaining one or more strobes of the plurality of strobes.

* * * * *